United States Patent
Jackson et al.

(10) Patent No.: US 12,075,703 B1
(45) Date of Patent: Aug. 27, 2024

(54) ENHANCED FREQUENCY BANDWIDTH OF CANTILEVER BEAM USING TRANSVERSE MOVABLE MASS

(71) Applicant: UNM Rainforest Innovations, Albuquerque, NM (US)

(72) Inventors: Nathan Morrow Jackson, Rio Rancho, NM (US); Luis Alfredo Rodriguez Milián, Coguas, PR (US)

(73) Assignee: UNM Rainforest Innovations, Albuquerque, NM (US)

( * ) Notice: Subject to any disclaimer, the term of this patent is extended or adjusted under 35 U.S.C. 154(b) by 567 days.

(21) Appl. No.: 17/404,679

(22) Filed: Aug. 17, 2021

Related U.S. Application Data

(60) Provisional application No. 63/066,640, filed on Aug. 17, 2020.

(51) Int. Cl.
| | |
|---|---|
| *H01L 41/113* | (2006.01) |
| *H10N 30/07* | (2023.01) |
| *H10N 30/30* | (2023.01) |
| *H10N 30/88* | (2023.01) |

(52) U.S. Cl.
CPC .......... *H10N 30/306* (2023.02); *H10N 30/07* (2023.02); *H10N 30/302* (2023.02); *H10N 30/88* (2023.02)

(58) Field of Classification Search
CPC ..... H10N 30/306; H10N 30/302; H10N 30/88
See application file for complete search history.

(56) References Cited

U.S. PATENT DOCUMENTS

| | | | | |
|---|---|---|---|---|
| 2013/0088123 A1* | 4/2013 | Haskett | .................. | H10N 30/88 310/329 |
| 2013/0328446 A1* | 12/2013 | Horiguchi | ............ | H10N 30/306 310/329 |
| 2015/0145376 A1* | 5/2015 | Sun | ...................... | H10N 30/304 29/25.35 |
| 2016/0254437 A1* | 9/2016 | Yao | ........................ | H10N 30/50 310/328 |
| 2020/0158564 A1* | 5/2020 | Yoon | .................... | H10N 30/302 |

OTHER PUBLICATIONS

Halim, Miah Abdul, et al., "A Frequency Up-Converted Hybrid Energy Harvester Using Transverse Impact-Driven Piezoelectric Bimorph for Human-Limb Motion", Micromachines 10, 701., (2019), 14 pgs.

(Continued)

*Primary Examiner* — Bryan P Gordon
(74) *Attorney, Agent, or Firm* — Schwegman Lundberg & Woessner, P.A.

(57) ABSTRACT

Frequency bandwidth of a cantilever beam system can be enhanced using a movable mass having motion in a cavity of a mass attached to cantilever beam, where the motion is transverse to the cantilever beam. In various embodiments, a cantilever beam apparatus includes a cantilever beam, a first mass, and a second mass. The first mass can be attached to the cantilever beam, with the first mass having a cavity arranged transverse to the cantilever beam. The second mass can be disposed in the cavity such that the second mass is movable in the cavity in a direction transverse to the cantilever beam. Apparatus, systems, and methods associated with enhanced frequency bandwidth of cantilever beam using transverse movable mass are applicable in a variety of applications.

25 Claims, 8 Drawing Sheets

(56) References Cited

OTHER PUBLICATIONS

Jackson, Nathan, et al., "Sloshing liquid-metal mass for widening the bandwidth of a vibration energy harvester", Sensors and Actuators A, 284, (2018), 17-21.

Jackson, Nathan, et al., "Widening the bandwidth of vibration energy harvesters using a liquid-based non-uniform load distribution", Sensors and Actuators A 246, (2016), 170-179.

Shi, GE, et al., "A broadband piezoelectric energy harvester with movable mass for frequency active self-tuning", Smart Mater. Struct. 29, 055023, (2020), 11 pgs.

\* cited by examiner

ENHANCED FREQUENCY BANDWIDTH OF CANTILEVER BEAM USING TRANSVERSE MOVABLE MASS

CLAIM OF PRIORITY

This application claims the priority benefit of U.S. Provisional Application Ser. No. 63/066,640, filed 17 Aug. 2020, entitled "ENHANCED FREQUENCY BANDWIDTH OF CANTILEVER BEAM USING TRANSVERSE MOVABLE MASS," which application is incorporated herein by reference in its entirety.

BACKGROUND

Resonant frequency cantilever designs are widely used in sensor technology as well as vibration energy harvesting devices. These cantilevers are typically designed to have high Q-factor or narrow bandwidth, which limits their capability of being applied to most vibration applications. Sources of vibration such as bridges, buildings, automotive etc. typically have a specific vibration frequency spectrum that is dependent on numerous factors. However, the frequency spectrum can change due to any number of factors. A frequency shift can be catastrophic for narrow bandwidth devices as it eliminates the devices potential for harvesting energy. Therefore, there is a need to widen the bandwidth.

Various methods have been investigated that have had limited results. These methods include Duffing resonators to create non-linear dynamic effects, but these typically have large hysteresis issues and require frequency sweeps as opposed to random frequency shifts that are typically found in most applications. Other techniques include magnetic or electrostatic forces, frequency up-conversion methods, and liquid sloshing effects. Energy harvesting cantilevers can be either macro-scale or micro-scale and methods for widening the bandwidth vary based on feasibility.

BRIEF DESCRIPTION OF THE DRAWINGS

Embodiments of the invention are illustrated by way of example and not limitation in the figures of the accompanying drawings in which.

DETAILED DESCRIPTION

Figure 1:
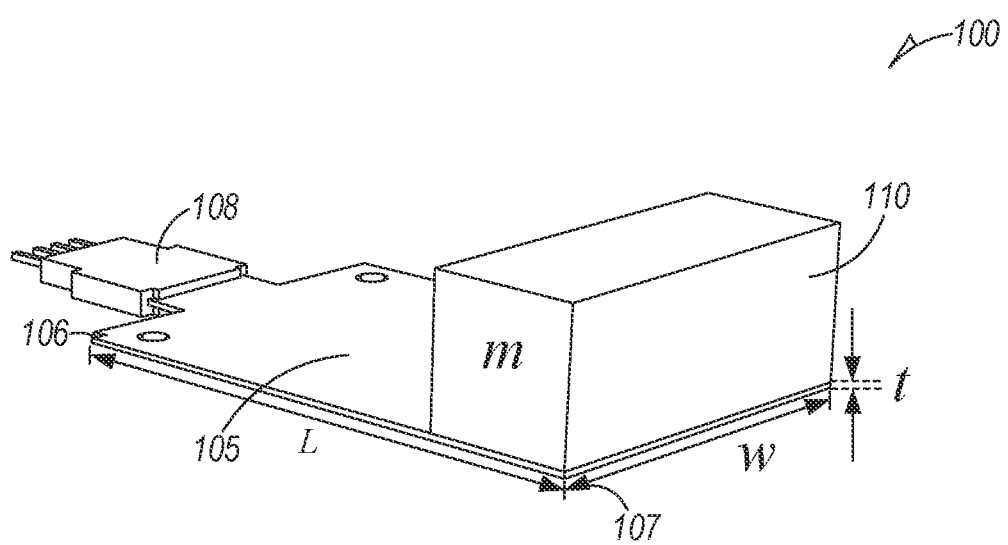
FIG. 1 illustrates a configuration of a traditional cantilever beam with a solid reference mass, in accordance with various embodiments.

The following detailed description refers to the accompanying drawings that show, by way of illustration and not limitation, various example embodiments of the invention. These embodiments are described in sufficient detail to enable those skilled in the art to practice these and other embodiments. In order to avoid obscuring embodiments of the invention, some well-known system configurations and process steps are not disclosed in detail. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a method of enhancing the frequency bandwidth of a cantilever beam is provided using transverse and rolling movable mass, which generates non-linear dynamic effects that alter the resonant frequency as a function of time. This arrangement generates a dynamic tuning effect, where the resonant frequency of the cantilever varies as the movable mass changes its location in x, y, and z direction. This dynamic tuning can essentially generate a wide bandwidth effect that is dependent on the acceleration applied, amount of movable mass, and location of the mass.

In various embodiments, an embedded movable mass method can be implemented to widen the bandwidth of a cantilever beam. An embodiment of an example method can use a transverse movable mass that moves in the vertical direction perpendicular to the cantilever beam. As the cantilever beam bends due to an applied acceleration, the movable mass is free to move in the transverse direction, which changes the overall mass of the system, which results in a change in resonant frequency. The movable mass can be implemented within a reference mass in which single or multiple cavities are created within the reference mass. A reference mass can also be referred to as a proof mass.

One or more moveable masses can be disposed in the single or multiple cavities of the reference mass. The one or more moveable masses can be movable objects, such as spheres or fluids, that can be integrated into the single or multiple cavities and sealed. As the beam bends, the movable mass component of the combination of the moveable mass in the reference mass will move, which will change the overall mass in the transverse mode of operation, or it will change the center of gravity if a longitudinal displacement mode is applied. Combinations of longitudinal and transverse movement can be combined to create unique bandwidth opportunities. The size, materials, and number of spheres within the cavity can have a significant impact on the bandwidth capabilities.

Wide bandwidth applications typically lower the amount of power that can be harvested so combinations of longitudinal and transverse movement can be combined to optimize both bandwidth and power generation. The bandwidth is dependent on the applied acceleration, frequency, amount of movable mass, number of movable spheres and their interaction, and design of the cavities. This method of widening the bandwidth can be applied to both macro-scale devices and micro-scale devices but tends to be optimal for low-frequency high-acceleration applications. Spheres, liquids, particles of various dimensions or anything that is able to move due to a vibration can be used to fill the cavities. Metallic spheres were used in initial testing to validate the method. Spheres or movable components can be made of various materials such as metals, polymers, ceramics etc. However, dense solids can provide the largest bandwidth due to having a more significant influence in the overall mass. The higher percentage of movable mass in the combination of the moveable mass in the reference mass can result in high resonant frequency variation.

Such methods can create a continuously varying resonant frequency device, where the cantilevers resonant frequency is continuously changing due to the location of the mass and the forces it applies to the cantilever. The power generated at a particular frequency can vary with time as the mass changes, which results in a widening effect.

A movable mass, embedded in hollow cylindrical chambers of a reference mass that is stationary with respect to a cantilever beam, is caused to move out-of-plane as the cantilever beam oscillates the movable mass. The movement of the movable mass effectively alters the overall effective mass of the cantilever beam—mass system during operation. This technique combines non-linear dynamics of the movable mass as well as the impact of the mass on the substrate with linear dynamics of the reference mass. This creates both a linear and non-linear dynamic region. The results of combining these regions increases bandwidth (non-linear region) while obtaining high power (linear region). With this combination, the bandwidth for a typical linear cantilever with a reference mass with a transverse movable mass can be significantly increased, while maintaining relatively high-power output, in comparison to a typical linear cantilever with a reference mass without a transverse movable mass. Dense movable masses used for transverse motion can be better for high acceleration, low frequency applications, but lower density movable masses can be more efficient for low acceleration applications.

Since bandwidth is one of the major challenges associated with vibration energy harvesting it has been extensively investigated. Previous attempts to solve this issue have included developing non-linear cantilevers or spring designs using duffing resonators, impact driven mechanical stoppers, additional magnetic forces, bistable non-linear devices, and designing an array of devices with varying frequency. However, these methods have numerous disadvantages such as hysteresis effects which depend on frequency sweep testing protocol, low power density as decreasing the Q-factor reduces the peak power harvested, larger footprint thus decreasing the overall power density, complex manufacturing especially at micro-scale, or the need for external power which reduces the overall efficiency of the system.

Recently, there has been numerous attempts to increase the bandwidth by using a lateral sliding mass which changes the center of gravity of the reference mass during oscillation, thus continuously changing the resonant frequency of the cantilever in a process referred to as dynamic tuning. This dynamic tuning has the effect of widening the bandwidth. Previous attempts to create a sliding mass include using rolling cylinders, sloshing liquids, and a combination of the two. These wide bandwidth methods involve altering the resonant frequency during cantilever oscillation by changing the effective reference mass using a lateral movable mass component. The various methods have demonstrated limited success as they rely on a large change in center of gravity to significantly increase the bandwidth. The large lateral displacements to widen the bandwidth are potentially feasible in macro-scale devices but scaling down to the micro-scale would limit lateral displacement of the movable mass. In addition, these devices increase the bandwidth, when compared to a traditional linear (stationary reference mass) system, but altering the center of gravity only has a minor effect on the overall effective mass, which limits the bandwidth enhancement capabilities.

A transverse movable mass has potential to significantly alter the effective mass of the system. The transverse movable mass is potentially a preferred option over a lateral sliding mass because it provides a larger change in the overall mass of the system, which correlates to an increase in bandwidth. The use of transverse movable mass may be applied to both macro and micro-scale devices. A piezoelectric cantilever with a transverse movable mass can be implemented as an energy harvesting system to widen the bandwidth of the energy harvesting system. The technique of implementing a transverse movable mass with a cantilever beam widening bandwidth can be implemented in cantilever devices other than piezoelectric cantilever devices. Design of a particular cantilever with transverse movable mass can include evaluations associated with varying the acceleration, amount of movable mass, size of movable mass, and varying material density of the movable mass, which may be dependent on the application to which the particular cantilever with transverse movable mass is to be utilized.

A simplistic equation for determining the resonant frequency of a rectangular cantilever beam with attached stationary reference mass is given by the equation:

$$f = \left(\frac{1}{2\pi}\sqrt{\frac{E}{4m}}\right)\sqrt{\frac{wt^3}{L^3}}$$

where E is the elastic modulus of the cantilever beam, m is the mass, w, t, and L are the width, thickness, and length of the cantilever beam. The resonant frequency can then be altered by changing the physical dimensions of the cantilever, the elastic modulus, or the mass. Changing the elastic modulus of the beam has been previously attempted as a tuning method but is difficult to implement in practical applications. Changing the dimensions of the beam during operation is typically not feasible. Therefore, changing the effective mass to alter the resonant frequency is the most feasible option of the abovementioned changes. Equation (1) assumes a simplistic point mass that is at the center of gravity. However, previous studies have demonstrated a more complex system that changes the center of gravity during operation using a lateral moving mass that can widen the bandwidth. A vertical moving mass does not change the center of gravity, but instead works by altering the overall effective mass during operation. Thus, the resonant frequency is constantly changing.

FIG. 1 illustrates a configuration 100 of a traditional cantilever beam 105 with a solid reference mass 110. Configuration 100 includes cantilever beam 105 having an end to be arranged as a fixed end 106 that can be coupled to a connector 108, which can function as a receiver to receive an electrical output from the cantilever beam in response to an applied mechanical stress applied to the cantilever beam. Cantilever beam 105 has a length L extending from fixed end 106 to a free end 107, a width w, and a thickness r. Configuration 100 includes solid reference mass 110, having mass m, attached to cantilever beam 105 at free end 107, where the solid reference mass 110 is stationary with respect to cantilever beam 105 due to the attachment of solid reference mass 110 to cantilever beam 105.

To alter the resonant frequency for power output of configuration 100, the solid reference mass 110 can be replaced by a reference mass having one or more cavities in which one of more movable masses are disposed. These movable masses can be caused to experience motion with the bending of the cantilever beam 105. With a reference mass with movable masses attached at free end 107 of cantilever beam 105, the motion of the movable masses can be more pronounced than with the reference mass attached closer to fixed end 106.

Figure 2B:
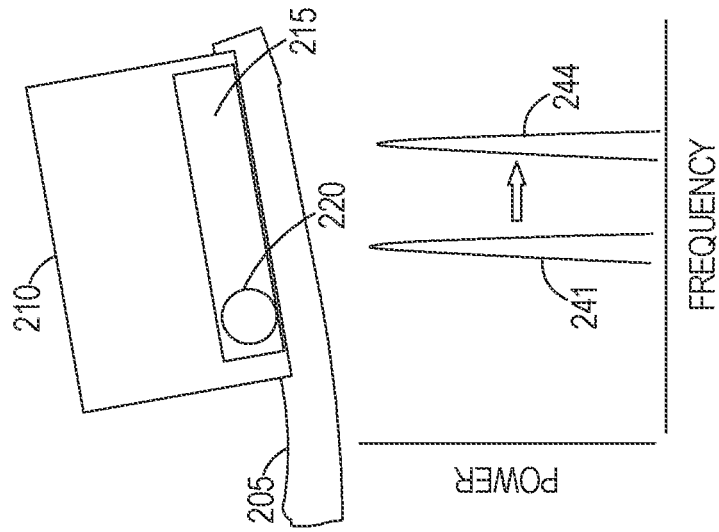
FIGS. 2A-2B are schematics of an example of longitudinal movement of a sphere in a cavity demonstrating mass movement with cantilever displacement and the effect on resonant frequency, in accordance with various embodiments.
Figure 2A:
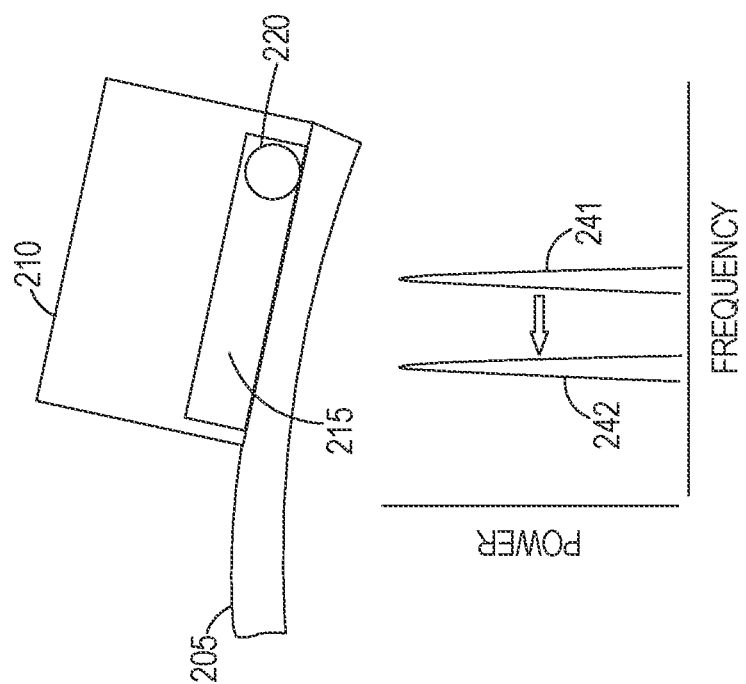

FIGS. 2A-2B are schematics of an example of longitudinal movement of a sphere in a cavity demonstrating mass movement with cantilever displacement and the effect on resonant frequency. FIG. 2A shows a plot of power versus frequency for a cantilever beam 205 having an attached mass 210 with a cavity 215 in which a sphere 220 is embedded. Sphere 220 is a movable mass in cavity 215. Curve 241 illustrates the position of the resonant frequency with respect to cantilever beam 205 in a horizontal position without bending. Curve 242 illustrates that the position of the resonant frequency has shifted to lower frequency with cantilever beam 205 bending downward and movable mass 220 having moved to the right end of cavity 215 as depicted in FIG. 2A.

FIG. 2B shows a plot of power versus frequency for cantilever beam 205 of FIG. 2A at another point in the oscillation of cantilever 205. Curve 241 illustrates the position of the resonant frequency with respect to cantilever beam 205 in a horizontal position without bending. Curve 244 illustrates the position of the resonant frequency being shifted to a higher frequency with cantilever beam 205 bending upward and movable mass 220 having moved to the left end of cavity 215, as depicted in FIG. 2B. FIGS. 2A-2B together depict that, as cantilever beam 205 oscillates back and forth between bending down and bending up, moveable mass moves right and left in cavity 215 and the resonant frequency oscillates around an effective center resonant frequency, which corresponds to cantilever beam 205 in a non-bent position between a lower frequency and a higher frequency.

To create a vertical movable mass with respect to a cantilever beam such that the movable mass does not move laterally with respect to the cantilever beam, a stationary reference mass with a single chamber or multiple chambers that can be partially filled with a solid movable mass can be designed, where the chamber prevents lateral movement of the solid mass. However, in this arrangement, the solid mass is free to move in the vertical direction, which is in a transverse direction to the plane of the cantilever beam. As the cantilever beam oscillates with a high amount of tip displacement, the movable solid mass will be propelled off the cantilever substrate and thus be in free fall. While the movable mass is in free fall, the effective mass of the system is significantly reduced depending on the mass of the movable solid mass. Therefore, during operation, the cantilever is continuously altering its resonant frequency, and thus effectively widening the bandwidth. Rather than a solid movable mass, liquids, particles of various dimensions, or other structures that can move due to a vibration can be used to partially fill a vertically arranged cavity, allowing transverse movement in the vertically arranged cavity.

Figure 3A:
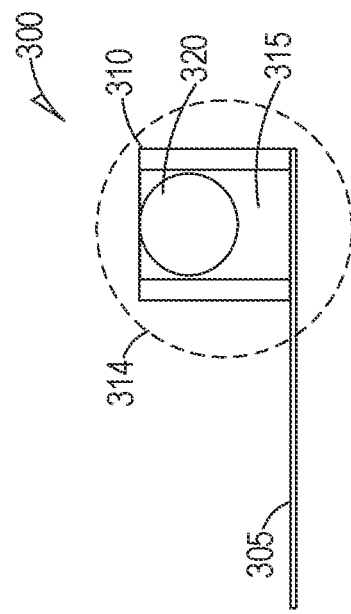
FIGS. 3A-3D are schematics of an example of transverse movement of a sphere demonstrating mass movement with cantilever displacement and the effect on resonant frequency, in accordance with various embodiments.

FIGS. 3A-3D are schematics of transverse movement of a sphere demonstrating mass movement with cantilever displacement and the effect on resonant frequency. A cantilever system 300 of FIGS. 3A and 3C include a cantilever beam 305 with a mass 310 attached to cantilever beam 305, where mass 310 includes a cavity 315 in which a movable mass 320 is embedded. In this example, movable mass 320 is a solid sphere 320. Cavity 315 is arranged transverse to cantilever beam 305. FIG. 3A shows cantilever beam 305 while at rest with solid sphere 320 at rest in contact with cantilever beam 305. Sphere 320 can be at rest in contact with cantilever beam 305 with mass 310 having a solid region defining a bottom of cavity 315, where the solid region contacts cantilever beam 305. The overall mass, m, 312 of cantilever system 300 of FIG. 3A effectively consists of stationary mass 310 having mass chamber 315 in which mass of the solid sphere 320 is disposed, with the mass of the cantilever beam 305 being considered negligible.

Figure 3B:
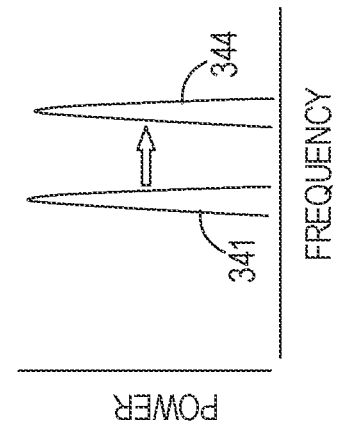
Figure 3C:
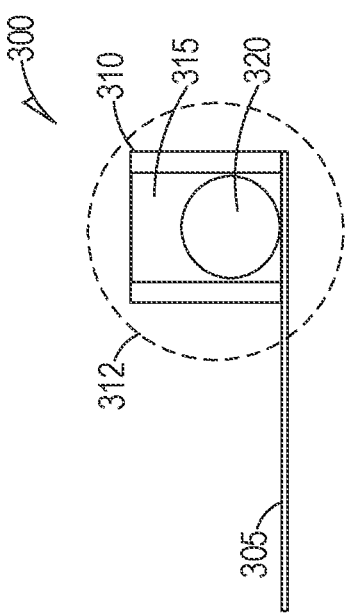
Figure 3D:
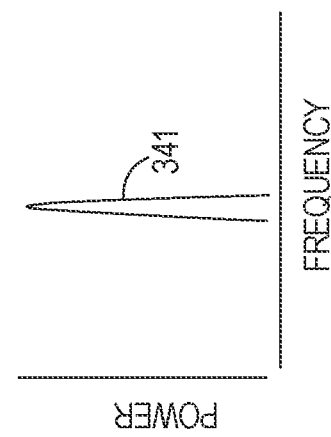

A second mode of operation occurs when the cantilever displacement is large causing the movable mass to displace as shown in FIG. 3B. In this mode, the overall effective mass, m', 314 only consists of the stationary mass 310, as the solid movable mass is in free fall, with the mass of the cantilever beam 305 being considered negligible. The technique of a cantilever beam having a movable transverse mass also involves an impact mode (not shown in FIG. 3C), which creates a non-linear dynamic effect. The impact mode is caused from the solid movable mass 320 falling due to gravity and impacting the cantilever beam 305 or a bottom region defining cavity 315 that contacts cantilever beam 305. The effect of the impact on the resonant frequency will depend on the force of the impact that is determined by the vertical displacement of the movable mass, the density of the mass, and the stiffness of cantilever beam 305, which acts as a substrate. In an embodiment, the technique of a cantilever beam having a movable transverse mass can be designed for low frequency, high acceleration applications, as the technique uses relatively large displacement of the cantilever to generate enough force to move the solid mass.

A cantilever beam system having a movable transverse mass involves non-linear dynamics due to both the impact as well as the change in the effective mass of the system. When the movable mass is stationary or at rest, the effective mass of the system will be significantly higher than when the movable mass is in free fall (depending on the density and amount of movable mass in the system). With the addition of the movable mass component, the resonant frequency of the system at rest will be significantly lower than the resonant frequency while the movable mass is in free fall (dependent on the amount of movable mass). Thus, the system will begin to oscillate at a lower frequency which will cause the movable mass to move out of plane. Since the time for the movable mass to fall and the time for the cantilever to complete a cycle are different, the system will be going in and out of resonant frequency, and additional higher frequencies from the impact of mass will cause the system to be non-linear.

Figure 4:
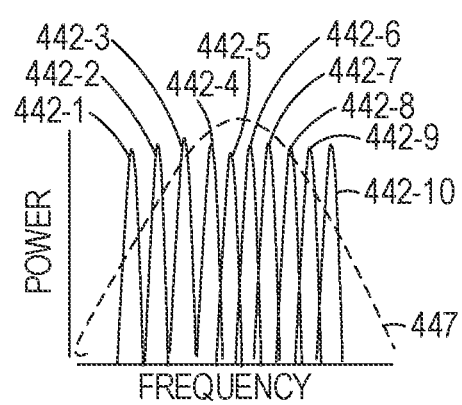
FIG. 4 illustrates an example in which resonant frequency of cantilever varies with time and movable mass, with summation of resonant frequencies resulting in wide bandwidth effect, in accordance with various embodiments.

FIG. 4 illustrates that resonant frequency of cantilever varies with time and movable mass. Summation of the resonant frequencies 442-1 . . . 442-10 can result in wide bandwidth effect 447. Though ten resonant frequencies are shown in the summation in FIG. 4, the number of resonant frequencies can be more or less than ten.

Figure 5A:
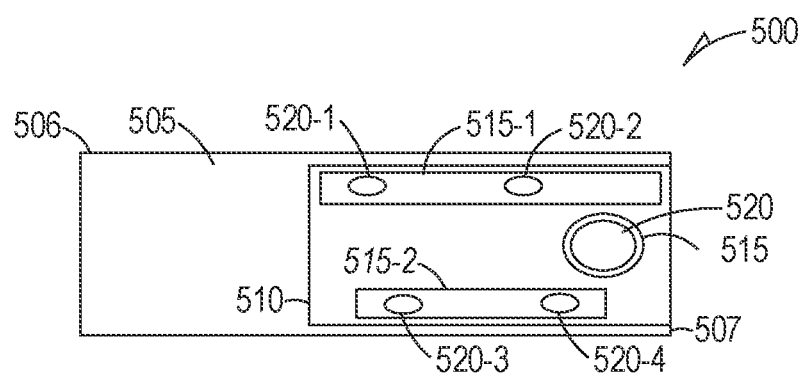
FIGS. 5A-5C shows an example cantilever beam system with a mass having a combination of movable masses in a number of cavities providing longitudinal and transverse movements, in accordance with various embodiments.
Figure 5B:
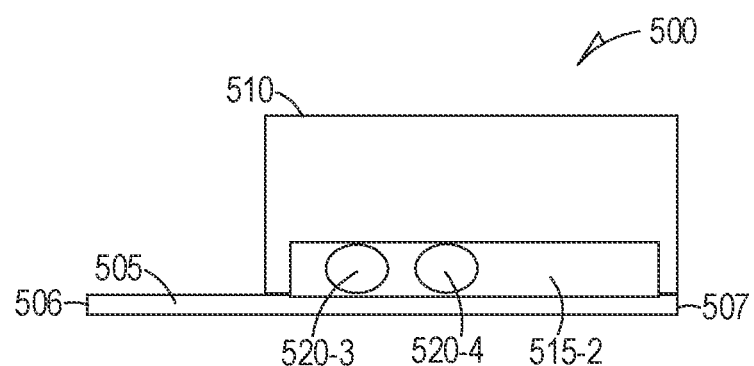
Figure 5C:
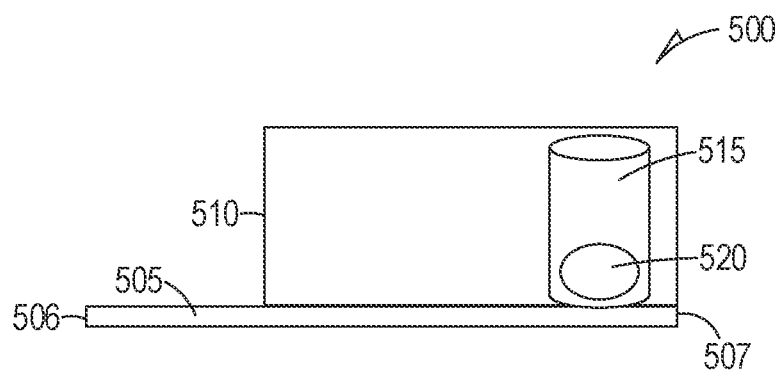

FIGS. 5A-5C shows a cantilever beam system 500 with a mass having a combination of movable masses in a number of cavities providing longitudinal and transverse movements. FIG. 5A is a top view of cantilever beam system 500. Cantilever beam system 500 includes a cantilever beam 505 and a mass 510, where mass 510 is a stationary mass with respect to cantilever beam 505. Mass 510 includes cavities 515, 515-1, and 515-2. Cavity 515 is arranged transverse to cantilever beam 505. A movable mass 520 is disposed in cavity 515 in a direction transverse to cantilever beam 505 and provides a transverse movement for cantilever beam system 500. Cavities 515-1 and 515-2 are arranged in a direction parallel to a length of cantilever beam 505, with the length being from a free end 507 of cantilever beam 505 to a support end 506 of cantilever beam 505. Cavities 515-1 and 515-2 contain two movable masses 520-1 and 520-2 and two movable masses 520-3 and 520-4, respectively, capable of moving in the direction parallel to the length of cantilever beam 505. Movable masses 520-1, 520-2, 520-3, and 520-4 provide longitudinal movements for cantilever beam system 500.

FIG. 5B is a cross-sectional side view of cantilever beam 505 showing cavity 515-2 and demonstrating rolling mass characteristic of movable masses 520-3 and 520-4 in cavity 515-2. FIG. 5C is a cross-sectional side view of cantilever beam 505 through the middle of cantilever beam 505 showing cavity 515 demonstrating capability of movable masses 520 to provide transverse mass displacement.

Figure 6:
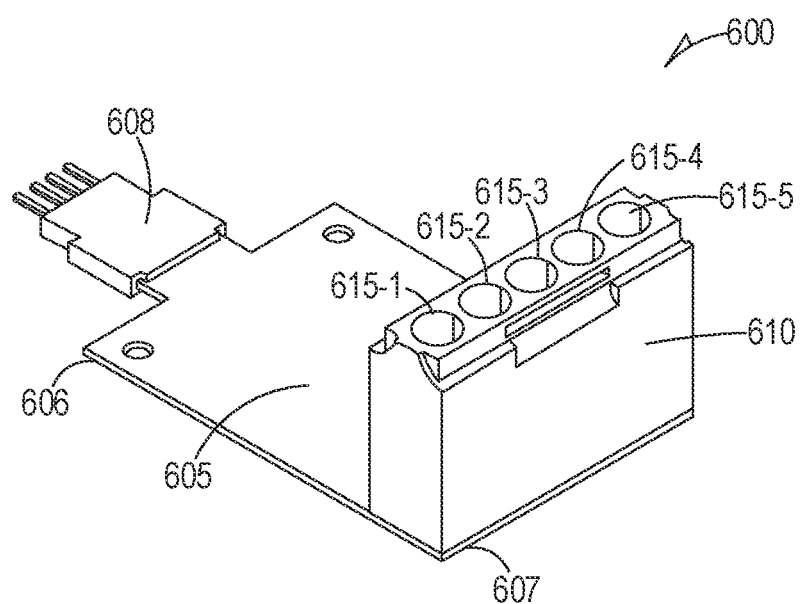
FIG. 6 illustrates an example cantilever beam system including a cantilever beam with an attached mass with vertical holes for movable masses, in accordance with various embodiments.

FIG. 6 illustrates a cantilever beam system 600 including a cantilever beam 605 with an attached mass 610 with vertical holes for movable masses. The vertical holes provide an array of cavities, where the array has a single row of cavities 615-1, 615-2, 615-3, 615-4, and 615-5. The single row can have more or less than five cavities. The array of cavities is arranged transverse to cantilever beam 605. At least one cavity of the array of cavities contains one or more movable masses capable of moving in the direction traverse to cantilever beam 605. Cantilever beam system 600 includes a lid that covers the row of cavities 615-1, 615-2, 615-3, 615-4, and 615-5. The lid is not shown for ease of showing the array of cavities. The lid maintains the one or more movable masses within the cavities 615-1, 615-2, 615-3, 615-4, and 615-5. The single row of cavities is arranged transverse to cantilever beam 605 with the cavities 615-1, 615-2, 615-3, 615-4, and 615-5 of the single row spaced along a direction perpendicular to a length of cantilever beam 605. The length is from a free end 607 of cantilever beam 605 to a support end 606 of cantilever beam 605. Support end 606 can be coupled to a connector 608 to provide a result of a force on the combination of cantilever beam 605 and mass 610. Mass 610 is stationary with respect to cantilever beam 605, though moveable masses can move within cavities 615-1, 615-2, 615-3, 615-4, and 615-5.

The one or more movable masses can be a sphere, a liquid, or particles of various dimensions capable of movement in one or more of cavities 615-1, 615-2, 615-3, 615-4, and 615-5. The material for the one or more movable masses can be a metal, a polymer, or a ceramic. The one or more movable masses can be sized to contact a wall of the cavity in which the one or more movable masses are disposed and maintain contact with the wall during movement in the respective cavity. The one or more movable masses are not limited to these sizes. Cantilever beam 605 can include a piezoelectric material or suitable material for a transducer of cantilever beam system 600.

Figure 7:
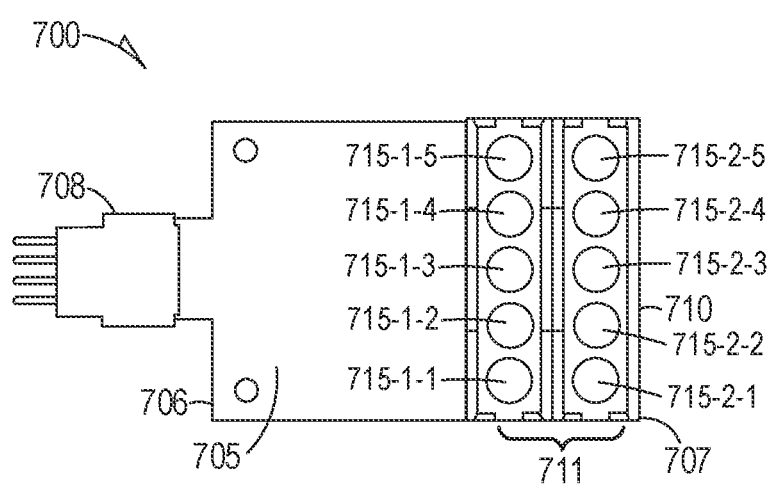
FIG. 7 illustrates an example cantilever beam system including a cantilever beam having an attached mass having an array of cavities, in accordance with various embodiments.

FIG. 7 illustrates a cantilever beam system 700 including a cantilever beam 705 having an attached mass 710 having an array 711 of cavities. Array 711 has two rows of cavities. One row of array 711 includes cavities 715-1-1, 715-1-2, 715-1-3, 715-1-4, and 715-1-5, and the other row includes cavities 715-2-1, 715-2-2, 715-2-3, 715-2-4, and 715-2-5. Though two rows are shown, array 711 can have more than two rows. Though five cavities are shown in each of the two rows, each row can individually have more or less than five cavities. Array 711 of cavities is arranged transverse to cantilever beam 705. At least one cavity of the array 711 of cavities contains one or more movable masses capable of moving in the direction traverse to cantilever beam 705. Cantilever beam system 700 includes a lid that covers array 711 of cavities. The lid is not shown for ease of showing array 711 of cavities. The lid maintains the one or more movable masses within array 711 of cavities. Each row of array 711 of cavities is arranged transverse to cantilever beam 705 with the cavities of each row spaced along a direction perpendicular to a length of cantilever beam 705. The length is from a free end 707 of cantilever beam 705 to a support end 706 of cantilever beam 705. Support end 706 can be coupled to a connector 708 to provide a result of a force on the combination of cantilever beam 705 and mass 710. Mass 710 is stationary with respect to cantilever beam 705, though moveable masses can move within cavities of array 711.

The one or more movable masses can be a sphere, a liquid, or particles of various dimensions capable of movement in one or more of cavities of array 711. The material for the one or more movable masses can be a metal, a polymer, or a ceramic. The one or more movable masses can be sized to contact a wall of the cavity in which the one or more movable masses are disposed and maintain contact with the wall during movement in the respective cavity. The one or more movable masses are not limited to these sizes. Cantilever beam 705 can include a piezoelectric material or suitable material for a transducer of cantilever beam system 700.

Figure 8:
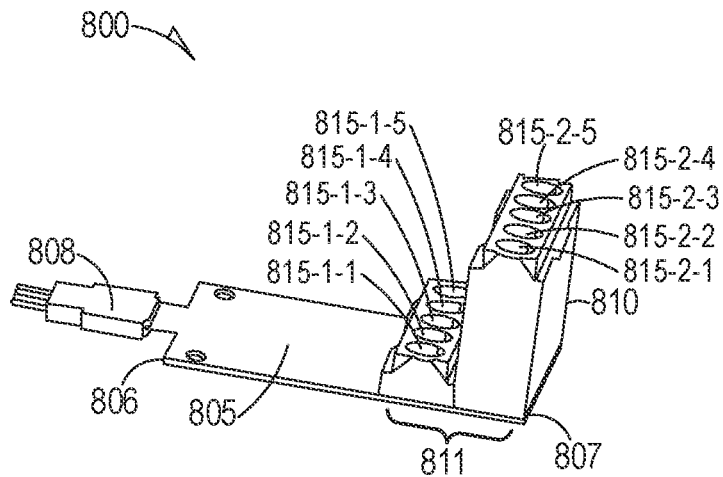
FIG. 8 illustrates an example cantilever beam system including a cantilever beam having an attached mass having an array of cavities with two sets of vertical holes for movable mass, in accordance with various embodiments.

FIG. 8 illustrates a cantilever beam system 800 including a cantilever beam 805 having an attached mass 810 having an array 811 of cavities with two sets of vertical holes for movable mass. Array 811 has two rows of cavities. One row of array 811 includes cavities 815-1-1, 815-1-2, 815-1-3, 815-1-4, and 815-1-5, and the other row includes cavities 815-2-1, 815-2-2, 815-2-3, 815-2-4, and 815-2-5. Though two rows are shown, array 811 can have more than two rows. Though five cavities are shown in each of the two rows, each row can individually have more or less than five cavities. Cavities 815-1-1, 815-1-2, 815-1-3, 815-1-4, and 815-1-5 can extend a first vertical distance from cantilever beam 805. Cavities 815-2-1, 815-2-2, 815-2-3, 815-2-4, and 815-2-5 can extend a second vertical distance from the cantilever beam. The first vertical distance can be less than the second vertical distance.

Array 811 of cavities is arranged transverse to cantilever beam 805. At least one cavity of the array of cavities contains one or more movable masses capable of moving in the direction traverse to cantilever beam 805. Cantilever beam system 800 includes a lid that covers array 811 of cavities. The lid is not shown for ease of showing array 811 of cavities. The lid maintains the one or more movable masses within array 811 of cavities. Each row of array 811 of cavities is arranged transverse to cantilever beam 805 with the cavities of each row spaced along a direction perpendicular to a length of cantilever beam 805. The length is from a free end 807 of cantilever beam 805 to a support end 806 of cantilever beam 805. Support end 806 can be coupled to a connector 808 to provide a result of a force on the combination of cantilever beam 805 and mass 810. Mass 810 is stationary with respect to cantilever beam 805, though moveable masses can move within cavities of array 811.

The one or more movable masses can be a sphere, a liquid, or particles of various dimensions capable of movement in one or more of cavities of array 811. The material for the one or more movable masses can a metal, a polymer, or a ceramic. The one or more movable masses can be sized to contact a wall of the cavity in which the one or more movable masses are disposed and maintain contact with the wall during movement in the respective cavity. The one or more movable masses are not limited to these sizes. Cantilever beam 805 can include a piezoelectric material or suitable material for a transducer of cantilever beam system 800.

Figure 9:
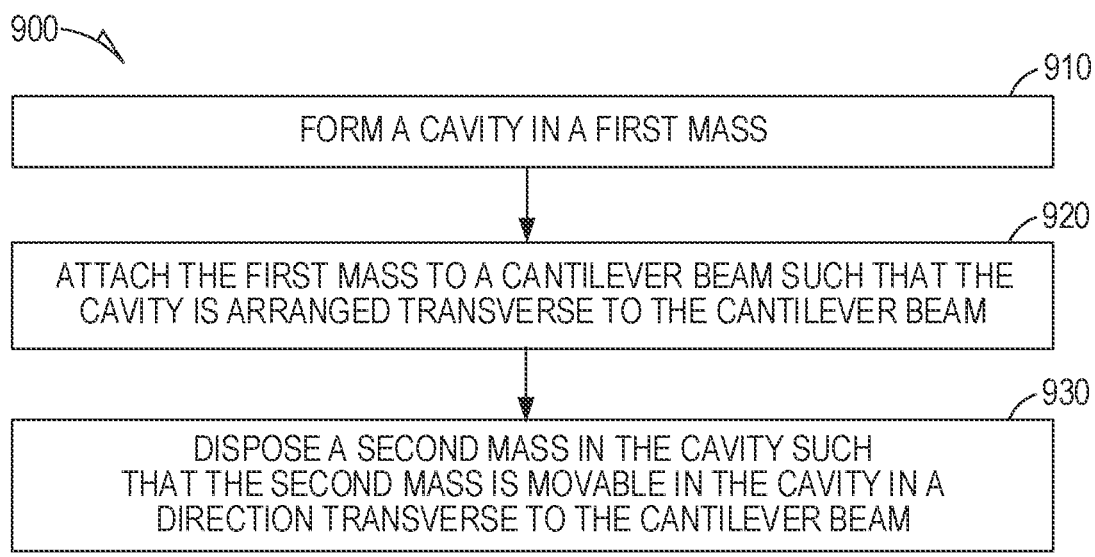
FIG. 9 is a flow diagram of features of an example method of forming a cantilever beam system, in accordance with various embodiments.

FIG. 9 is a flow diagram of features of an embodiment of an example method of forming a cantilever beam system. At 910, a cavity is formed in a first mass. At 920, the first mass is attached to a cantilever beam such that the cavity is arranged transverse to the cantilever beam. At 930, a second mass is disposed in the cavity such that the second mass is movable in the cavity in a direction transverse to the cantilever beam. The second mass can be disposed in the cavity of the first mass prior to attaching the first mass to the cantilever beam. A lid can be placed on the first mass covering the cavity such that the second mass is contained and maintained in the cavity.

Variations of method 900 or methods similar to method 900 can include a number of different embodiments that may be combined depending on the application of such methods and/or the architecture of devices or systems in which such methods are implemented. Such methods can include forming the first mass with additional cavities containing one or more additional masses to provide a combination of longitudinal and transverse movement of masses within the first mass. Variations of method 900 or methods similar to method 900 can include forming the first mass having one row of cavities arranged, with attachment of the first mass to the cantilever beam, transverse to the cantilever beam with the cavities of the one row spaced along a direction perpendicular to a length of the cantilever beam. The length is from a free end of the cantilever beam to a support end of the cantilever beam, with at least one cavity of the one row containing one or more movable masses capable of moving in the direction traverse to the cantilever beam.

Variations of method 900 or methods similar to method 900 can include forming the first mass having an array of cavities arranged, with attachment of the first mass to the cantilever beam, transverse to the cantilever beam, with at least one cavity of the array containing one or more movable masses capable of moving in the direction traverse to the cantilever beam. The array can have multiple rows of cavities arranged transverse to the cantilever beam, with cavities of each row of the multiple rows spaced along a direction perpendicular to a length of the cantilever beam. The length is from a free end of the cantilever beam to a support end of the cantilever beam. The cavities of a first row of the multiple rows of cavities can be formed to extend a first vertical distance from the cantilever beam. The cavities of a second row of the multiple rows of cavities can be formed to extend a second vertical distance from the cantilever beam, where the first vertical distance is less than the second vertical distance.

Variations of method 900 or methods similar to method 900 can include providing electrodes at a support end of the cantilever beam to couple to a receiver. The receiver can be structured to receive an electrical signal from the cantilever beam in response to the cantilever beam subjected to a bending force. Variations can include selecting the second mass to increase bandwidth of a completed energy harvester using the cantilever beam, the first mass, and the second mass. The increased bandwidth can be evaluated in comparison to a bandwidth of a completed energy harvester using the cantilever beam and the first mass without the first mass having a cavity containing the second mass.

In various embodiments, a machine-readable storage device, such as computer-readable medium, can comprise instructions stored thereon, which, when performed by a machine, cause the machine to perform operations. The instructions can be executed by one or more processors associated with the machine, where the operations comprise one or more actions to control or operate a transverse mass cantilever beam device having structural features similar to or identical to features of cantilever beam apparatus and techniques described with respect to cantilever beam apparatus, variations thereof, and/or features of other techniques taught herein such as associated with FIGS. 1-10. The physical structures of such instructions can be operated on by one or more processors. For example, executing these physical structures can cause the machine to perform operations comprising operations to receive an electrical signal from one or more transverse mass cantilever beam devices and apply the receive electrical signal to an instrumentality of a system for which the one or more transverse mass cantilever beam devices are implemented. The operations can include selectively transferring power to an application circuit of the system in response to reception of the electrical signal. The stored instructions and the one or more processors can be implemented in control circuitry to control operation of the cantilever beam such as, but not limited to, controlling instrumentality to apply a bending force to the cantilever beam, in accordance with applications for which the system is designed. The stored instructions and the one or more processors can be implemented as part of one or more systems having energy harvesters.

In various embodiments, an apparatus comprises a cantilever beam, a first mass, and a second mass. The first mass is attached to the cantilever beam, with the first mass having a cavity arranged transverse to the cantilever beam. The second mass is disposed in the cavity such that the second mass is movable in the cavity in a direction transverse to the cantilever beam. The cantilever beam, the first mass, and the second mass can be selected from a number of structures having different properties. The second mass can be a sphere, a liquid, or particles of various dimensions capable of movement in the cavity. The second mass can include material selected from one or more of a metal, a polymer, or a ceramic. The second mass can be sized to contact a wall of the cavity and maintain contact with the wall during movement in the cavity. The one or more movable masses are not limited to these sizes. The cantilever beam can include a piezoelectric material or suitable material for a transducer for the cantilever beam.

Variations of such an apparatus can include a number of different embodiments that may be combined depending on the application of such apparatus and/or the architecture in which such apparatus are implemented. Such apparatus can include the first mass having one or more additional cavities with the one or more additional cavities arranged in a direction parallel to a length of the cantilever beam, where the length is from a free end of the cantilever beam to a support end of the cantilever beam. Each of the one or more additional cavities can contain one or more movable masses capable of moving in the direction parallel to the length of the cantilever beam. Variations can include the first mass having an array of cavities arranged transverse to the cantilever beam with at least one cavity of the array of cavities containing one or more movable masses capable of moving in the direction traverse to the cantilever beam. The array of cavities can include one row of cavities arranged transverse to the cantilever beam with the cavities of the one row spaced along a direction perpendicular to a length of the cantilever beam, where the length is from a free end of the cantilever beam to a support end of the cantilever beam.

Variations can include the array of cavities having multiple rows of cavities arranged transverse to the cantilever beam with cavities of each row of the multiple rows spaced along a direction perpendicular to a length of the cantilever beam, where the length is from a free end of the cantilever beam to a support end of the cantilever beam. Variations can include cavities of a first row of the multiple rows of cavities extending a first vertical distance from the cantilever beam and cavities of a second row of the multiple rows of cavities extending a second vertical distance from the cantilever beam, with the first vertical distance being less than the second vertical distance.

In various embodiments, a system can comprise a cantilever beam, a first mass, a second mass, and a receiver. The first mass is attached to the cantilever beam and has a cavity arranged transverse to the cantilever beam. The second mass is disposed in the cavity such that the second mass is movable in the cavity in a direction transverse to the cantilever beam. The receiver is coupled to the cantilever beam to receive an electrical signal in response to the cantilever beam subjected to a bending force.

Variations of such a system can include a number of different embodiments that may be combined depending on the application of such systems and/or the architecture in which such systems are implemented. Such a system can include the first mass having one or more additional cavities with the one or more additional cavities containing one or more movable masses capable of longitudinal movement in a direction parallel to a length of the cantilever beam. The length is from a free end of the cantilever beam to a support end of the cantilever beam.

Variations can include the first mass having one row of cavities arranged transverse to the cantilever beam with the cavities of the one row spaced along a direction perpendicular to a length of the cantilever beam, with at least one cavity of the one row containing one or more movable masses capable of moving in the direction traverse to the cantilever beam. The length is from a free end of the cantilever beam to a support end of the cantilever beam.

Variations can include the first mass having an array of cavities arranged transverse to the cantilever beam, with at least one cavity of the array containing one or more movable masses capable of moving in the direction traverse to the cantilever beam, with the array having multiple rows of cavities arranged transverse to the cantilever beam, and with cavities of each row of the multiple rows spaced along a direction perpendicular to a length of the cantilever beam. The length is from a free end of the cantilever beam to a support end of the cantilever beam. The cavities of a first row of the multiple rows of cavities can extend a first vertical distance from the cantilever beam and cavities of a second row of the multiple rows of cavities can extend a second vertical distance from the cantilever beam, with the first vertical distance being less than the second vertical distance.

Variations of such a system can include the cantilever beam comprising a piezoelectric material, with the cantilever beam coupled to the receiver to provide a voltage to the receiver in response to the cantilever beam subjected to a bending force. Variations can include the system having control circuitry to transfer power to an application circuit of the system in response to reception of the electrical signal by the receiver. The control circuitry can be structured to control operation of the cantilever beam. For example, the control circuitry can control instrumentality to apply a bending force to the cantilever beam, in accordance with applications for which the system is designed.

Figure 10:
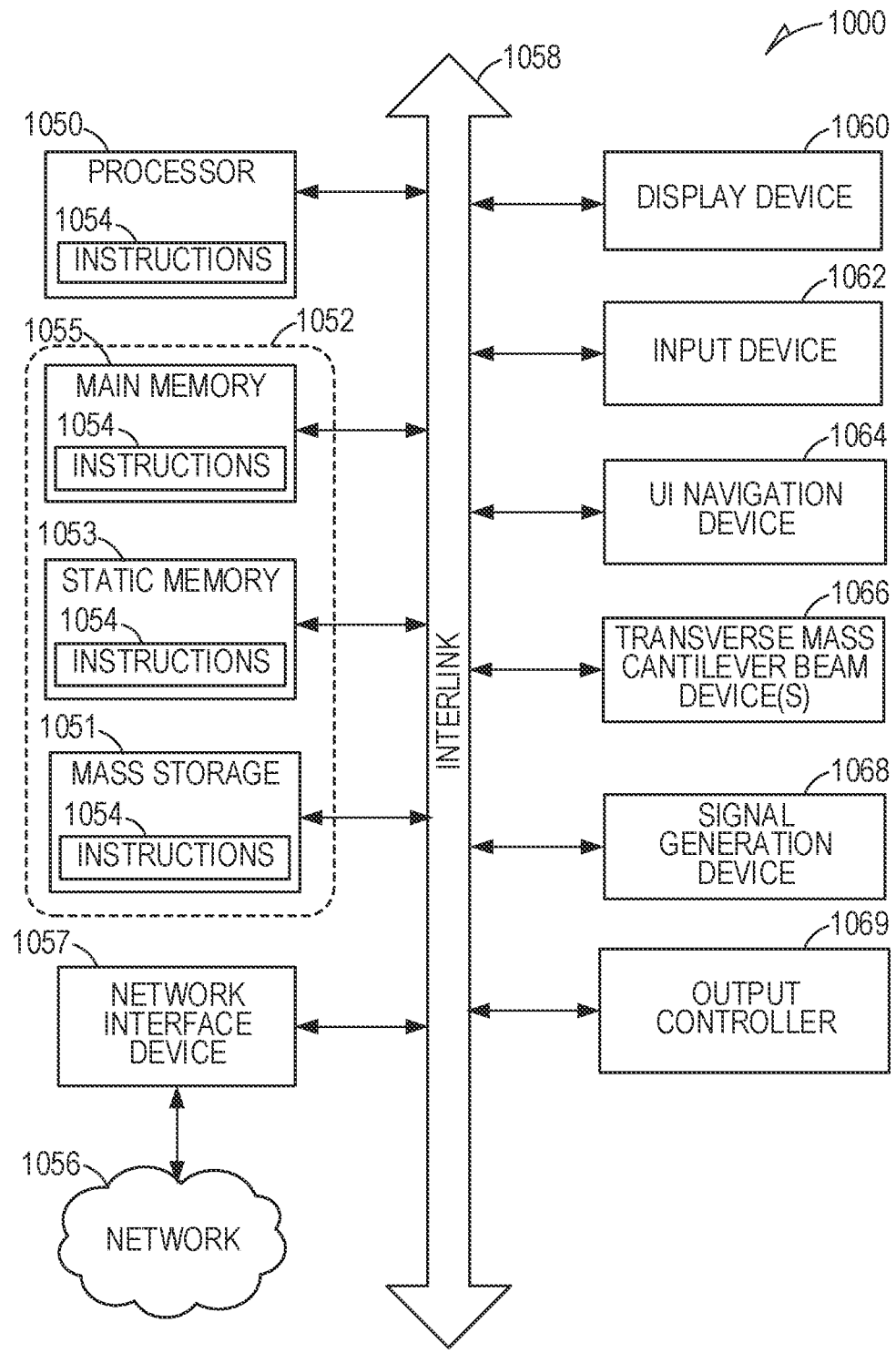
FIG. 10 is a block diagram illustrating components of an example system that can implement algorithms and perform methods structured to operate in conjunction with one or more transverse mass cantilever beam devices, in accordance with various embodiments.

FIG. 10 is a block diagram illustrating components of an embodiment of an example system 1000 that can implement algorithms and perform methods structured to operate in conjunction with one or more transverse mass cantilever beam devices 1066 as taught herein. System 1000 can include one or more processors 1050 that can be structured to execute stored instructions to perform functions to control, manage, or use output of one or more transverse mass cantilever beam devices 1066.

System 1000 may operate as a standalone system or may be connected, for example networked, to other systems. In a networked deployment, system 1000 can operate in the capacity of a server machine, a client machine, or both in server-client network environments. In an example, system 1000 can act as a peer machine in peer-to-peer (P2P) (or other distributed) network environment. Further, while only a single system is illustrated, the term "system" shall also be taken to include any collection of systems that individually or jointly execute a set (or multiple sets) of instructions to perform any one or more of the methodologies discussed herein.

System 1000 can be a machine (e.g., a computer-based machine) and can include a hardware processor 1050 (e.g., a CPU, a GPU, a hardware processor core, or any combination thereof), a main memory 1055, and a static memory 1053, some or all of which can communicate with each other via components of an interlink (e.g., bus) 1058. The interlink 1058 can include a number of different communication mechanisms such as different wired communication mechanisms, different wireless communication mechanisms, and different power distribution networks. System 1000 can further include a display device 1060, an alphanumeric input device 1062 (e.g., a keyboard), and a user interface (UI) navigation device 1064 (e.g., a mouse). In an example, display device 1060, input device 1062, and UI navigation device 1064 can be a touch screen display. System 1000 can additionally include a mass storage device (e.g., drive unit) 1051, one or more signal generation devices 1068. System 1000 can include other sensors, such as a global positioning system (GPS) sensor, compass, accelerometer, or other communication-enabled sensors. System 1000 can include an output controller 1069, such as a serial (e.g., USB, parallel, or other wired or wireless (e.g., infrared (IR), near field communication (NFC), etc.) connection to communicate or control one or more peripheral devices (e.g., a printer, card reader, etc.).

System 1000 can include a machine-readable medium 1052 on which is stored one or more sets of data structures or instructions 1054 (e.g., software) embodying or utilized by system 1000 to perform any one or more of the techniques or functions for which system 1000 is designed. Instructions 1054 can also reside, completely or at least partially, within main memory 1055, within static memory 1053, or within hardware processor 1050 during execution thereof by system 1000. In an example, one or any combination of hardware processor 1050, main memory 1055, static memory 1053, or mass storage device 1051 can constitute machine-readable medium 1052.

Instructions 1054 (e.g., software, programs, an operating system (OS), etc.) or other data can be stored on the mass storage device 1051 and can be accessed by main memory 1055 for use by processor 1050. Main memory 1055 (e.g., DRAM) is typically fast, but volatile, and thus a different type of storage than mass storage device 1051 (e.g., an SSD), which is suitable for long-term storage, including while in an "off" condition. Instructions 1054 or data in use by a user or system 1000 are typically loaded in main memory 1055 for use by processor 1050. When main memory 1055 is full, virtual space from mass storage device 1051 can be allocated to supplement main memory 1055; however, because mass storage device 1051 is typically slower than main memory 1055, and write speeds are typically at least twice as slow as read speeds, use of virtual memory can greatly reduce user experience due to storage device latency (in contrast to main memory 1055, e.g., DRAM). Further, use of mass storage device 1051 for virtual memory can greatly reduce the usable lifespan of mass storage device 1051.

Instructions 1054, data, results of data analysis, or power elements can further be transmitted or received over a network 1056 using a transmission medium via a network interface device 1057 utilizing any one of a number of transfer protocols (e.g., frame relay, Internet protocol (IP), transmission control protocol (TCP), user datagram protocol (UDP), hypertext transfer protocol (HTTP), power transfer protocols etc.). Example network 1056 can include one or more communication networks having a local area network (LAN), a wide area network (WAN), a packet data network (e.g., the Internet), mobile telephone networks (e.g., cellular networks), Plain Old Telephone (POTS) networks, and wireless data networks, among others. In an example, the network interface device 1057 can include one or more physical jacks (e.g., Ethernet, coaxial, or phone jacks) or one or more antennas to connect to the communications network 1056. In an example, the network interface device 1057 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions or data to and for execution by the machine 1000, and includes instrumentalities to propagate digital or analog communications signals to facilitate communication of such instructions, which instructions can be implemented by software.

Various applications can be implemented with a cantilever beam device having a widened bandwidth, as compared to conventional cantilever beam devices, by creating a transverse movable mass system coupled to a cantilever beam. In some arrangements, a movable mass system is attached to a cantilever beam, with a mass constituent having a vertical component and a horizontal component relative to the cantilever beam. Bandwidth and power effects can be dependent on various properties of the transverse movable mass. Transverse movable mass cantilever beam devices can include a piezoelectric energy harvesting cantilever, but cantilever beams with a transverse movable mass can be applied to other energy harvesting systems such as electromagnetic harvesting systems and electrostatic harvesting systems, as well as other cantilever applications that can benefit from a wide bandwidth.

Although specific embodiments have been illustrated and described herein, it will be appreciated by those of ordinary skill in the art that any arrangement that is calculated to achieve the same purpose may be substituted for the specific embodiments shown. Upon studying the disclosure, it will be apparent to those skilled in the art that various modifications and variations can be made in the devices and methods of various embodiments of the invention. Various embodiments can use permutations and/or combinations of embodiments described herein. Other embodiments will be apparent to those skilled in the art from consideration of the specification and practice of the embodiments disclosed herein. It is to be understood that the above description is intended to be illustrative, and not restrictive, and that the phraseology or terminology employed herein is for the purpose of description.

What is claimed is:

1. An apparatus comprising:
   a cantilever beam;
   a first mass attached to the cantilever beam, with the first mass having a cavity arranged transverse to the cantilever beam; and
   a second mass disposed in the cavity such that the second mass is movable in the cavity in a direction transverse to the cantilever beam.

2. The apparatus of claim 1, wherein the first mass includes one or more additional cavities with the one or more additional cavities arranged in a direction parallel to a length of the cantilever beam, the length being from a free end of the cantilever beam to a support end of the cantilever beam, each of the one or more additional cavities containing one or more movable masses capable of moving in the direction parallel to the length of the cantilever beam.

3. The apparatus of claim 1, wherein the first mass includes an array of cavities arranged transverse to the cantilever beam with at least one cavity of the array of cavities containing one or more movable masses capable of moving in the direction traverse to the cantilever beam.

4. The apparatus of claim 3, wherein the array of cavities includes one row of cavities arranged transverse to the cantilever beam with the cavities of the one row spaced along a direction perpendicular to a length of the cantilever beam, the length being from a free end of the cantilever beam to a support end of the cantilever beam.

5. The apparatus of claim 3, wherein the array of cavities includes multiple rows of cavities arranged transverse to the cantilever beam with cavities of each row of the multiple rows spaced along a direction perpendicular to a length of the cantilever beam, the length being from a free end of the cantilever beam to a support end of the cantilever beam.

6. The apparatus of claim 5, wherein cavities of a first row of the multiple rows of cavities extend a first vertical distance from the cantilever beam and cavities of a second row of the multiple rows of cavities extends a second vertical distance from the cantilever beam, with the first vertical distance being less than the second vertical distance.

7. The apparatus of claim 1, wherein the second mass is a sphere.

8. The apparatus of claim 1, wherein the second mass is a liquid or particles of various dimensions capable of movement in the cavity.

9. The apparatus of claim 1, wherein the second mass includes a metal, a polymer, or a ceramic.

10. The apparatus of claim 1, wherein the second mass is sized to contact a wall of the cavity and maintain contact with the wall during movement in the cavity.

11. The apparatus of claim 1, wherein the cantilever beam includes a piezoelectric material.

12. A system comprising:
a cantilever beam;
a first mass attached to the cantilever beam, with the first mass having a cavity arranged transverse to the cantilever beam;
a second mass disposed in the cavity such that the second mass is movable in the cavity in a direction transverse to the cantilever beam; and
a receiver coupled to the cantilever beam to receive an electrical signal in response to the cantilever beam subjected to a bending force.

13. The system of claim 12, wherein the first mass includes one or more additional cavities with the one or more additional cavities containing one or more movable masses capable of longitudinal movement in a direction parallel to a length of the cantilever beam, the length being from a free end of the cantilever beam to a support end of the cantilever beam.

14. The system of claim 12, wherein the first mass includes one row of cavities arranged transverse to the cantilever beam with the cavities of the one row spaced along a direction perpendicular to a length of the cantilever beam, the length being from a free end of the cantilever beam to a support end of the cantilever beam, with at least one cavity of the one row containing one or more movable masses capable of moving in the direction traverse to the cantilever beam.

15. The system of claim 12, wherein the first mass includes an array of cavities arranged transverse to the cantilever beam, with at least one cavity of the array containing one or more movable masses capable of moving in the direction traverse to the cantilever beam, the array having multiple rows of cavities arranged transverse to the cantilever beam, with cavities of each row of the multiple rows spaced along a direction perpendicular to a length of the cantilever beam, the length being from a free end of the cantilever beam to a support end of the cantilever beam.

16. The system of claim 15, wherein cavities of a first row of the multiple rows of cavities extend a first vertical distance from the cantilever beam and cavities of a second row of the multiple rows of cavities extends a second vertical distance from the cantilever beam, with the first vertical distance being less than the second vertical distance.

17. The system of claim 12, wherein the cantilever beam includes a piezoelectric material, with the cantilever beam coupled to the receiver to provide a voltage to the receiver in response to the cantilever beam subjected to a bending force.

18. The system of claim 17, wherein the system includes control circuitry to transfer power to an application circuit of the system in response to reception of the electrical signal by the receiver.

19. The system of claim 18, wherein the control circuitry is structured to control operation of the cantilever beam.

20. A method comprising:
forming a cavity in a first mass;
attaching the first mass to a cantilever beam such that the cavity is arranged transverse to the cantilever beam; and
disposing a second mass in the cavity such that the second mass is movable in the cavity in a direction transverse to the cantilever beam.

21. The method of claim 20, wherein the method includes providing electrodes at a support end of the cantilever beam to couple to a receiver, with the receiver structured to receive an electrical signal from the cantilever beam in response to the cantilever beam subjected to a bending force.

22. The method of claim 20, wherein the method includes selecting the second mass to increase bandwidth of a completed energy harvester using the cantilever beam, the first mass, and the second mass, with the bandwidth increased in comparison to a bandwidth of a completed energy harvester using the cantilever beam and the first mass without the first mass having a cavity containing the second mass.

23. The method of claim 20, wherein the method includes forming the first mass with additional cavities containing one or more additional masses to provide a combination of longitudinal and transverse movement of masses within the first mass.

24. The method of claim 20, wherein the method includes forming the first mass having one row of cavities arranged, with attachment of the first mass to the cantilever beam, transverse to the cantilever beam with the cavities of the one row spaced along a direction perpendicular to a length of the cantilever beam, the length being from a free end of the cantilever beam to a support end of the cantilever beam, with at least one cavity of the one row containing one or more movable masses capable of moving in the direction traverse to the cantilever beam.

25. The method of claim 20, wherein the method includes:
forming the first mass having an array of cavities arranged, with attachment of the first mass to the cantilever beam, transverse to the cantilever beam, with at least one cavity of the array containing one or more movable masses capable of moving in the direction traverse to the cantilever beam, the array having multiple rows of cavities arranged transverse to the cantilever beam, with cavities of each row of the multiple rows spaced along a direction perpendicular to a length of the cantilever beam, the length being from a free end of the cantilever beam to a support end of the cantilever beam;
forming the cavities of a first row of the multiple rows of cavities to extend a first vertical distance from the cantilever beam; and
forming the cavities of a second row of the multiple rows of cavities to extend a second vertical distance from the cantilever beam, with the first vertical distance being less than the second vertical distance.

\* \* \* \* \*